United States Patent [19]

Garde

[11] Patent Number: 4,811,296

[45] Date of Patent: Mar. 7, 1989

[54] MULTI-PORT REGISTER FILE WITH FLOW-THROUGH OF DATA

[75] Inventor: Douglas Garde, Dover, Mass.

[73] Assignee: Analog Devices, Inc., Norwood, Mass.

[21] Appl. No.: 51,086

[22] Filed: May 15, 1987

[51] Int. Cl.[4] .......................... G11C 7/00; G11C 11/40
[52] U.S. Cl. ........................................ 365/189; 365/230
[58] Field of Search ................................ 365/189, 230

[56] References Cited

U.S. PATENT DOCUMENTS

| | | | |
|---|---|---|---|
| 4,078,261 | 3/1978 | Millhollan | 365/189 |
| 4,090,258 | 5/1978 | Cricchi | 365/184 |
| 4,447,891 | 5/1984 | Kadota | 365/189 X |
| 4,535,428 | 8/1985 | Furman | 365/230 |
| 4,554,645 | 11/1985 | Furman | 365/189 |
| 4,558,433 | 12/1985 | Bernstein | 365/189 |
| 4,610,004 | 9/1986 | Moller et al. | 365/230 |
| 4,623,990 | 11/1986 | Allen et al. | 365/189 |
| 4,719,596 | 1/1988 | Bernstein et al. | 365/189 |

*Primary Examiner*—Stuart N. Hecker
*Assistant Examiner*—Alyssa H. Bowler
*Attorney, Agent, or Firm*—Wolf, Greenfield & Sacks

[57] ABSTRACT

A multiport RAM register file adapted for flowing data directly from an input port to an output port and for simultaneously writing to a location in the register file. In addition to the RAM register, the apparatus includes (1) a first set of multiplexers between the input ports and the RAM, (2) a second set of multiplexers between the output of the RAM and the output ports and (3) logic for controlling the multiplexers and writing to the RAM. The input multiplexers are controlled by flow-through address comparators; the output multiplexers are controlled by read address comparators. The data at any input port of the register file may be written to any of the RAM data bit buses by selecting the input multiplexer appropriately. Because the bit buses are being driven, this data simultaneously may be passed to the RAM output just as if the RAM were being read—i.e., as a flow-through. Further, if the RAM address lines are activated concurrently, this data can be written to a selected cell while it is flowing-through to the output port. The output multiplexers feed the data from the bit lines to a selected output port (or ports).

4 Claims, 1 Drawing Sheet

3,811,296

MULTI-PORT REGISTER FILE WITH FLOW-THROUGH OF DATA

FIELD OF THE INVENTION

This invention relates to the field of memory systems in digital computers and, more specifically, to a random access read/write memory (RAM) device or system with multiple input and/or output ports. In current terminology, these devices are called multiport register files. The invention provides a multiport register file wherein information may be written to a location therein as it is simultaneously being read out at one or more output ports thereof.

BACKGROUND OF THE INVENTION

Typical prior art multiport register files are shown in, for example, U.S. Pat. Nos. 4,535,428, issued Aug. 13, 1985 to Anatol Furman; and 4,558,433 issued Dec. 10, 1985 to Cary Bernstein. The disclosures of those patents are hereby incorporated by reference for background information.

Multiport register files normally operate from a clock signal which controls the timing of reading and writing operations with respect to the register file's memory. Typically, the clock cycle establishes specific times when data can be written into the register file and other times when data can be read from the register file. For example, during the first half of a clock cycle, data may be written into the memory; and during the second half of the clock cycle, data may be read from the memory. Therefore, in such normal operation, when data is to be passed from a particular input port to a particular output port of the multiport register file, the data must first be written into the RAM during one clock cycle and then read out from the RAM during the next (or a later) clock cycle.

Additional restrictions on read/write operation may be imposed by the internal architecture of these devices. As stated in the Bernstein and Furman patents, care must be taken in such multiport register files to protect the integrity of the stored data during read and write operations. Normally, the bitlines in a RAM cell (i.e., the conductors over which data bits are supplied for writing to or reading from the cells) are pre-charged to a level corresponding to the complementary value of the cell data. If a number of ports are turned on simultaneously to access a given cell, though, that cell may lose its data. To avoid this loss of data, larger size, more elaborate cell structures may be used or cell access can be restricted to one set of bitlines at a time, with data being reapplied to the other ports as required, outside the RAM structure itself. That is, when an address coincidence is detected among the ports (indicating that two or more ports seek access to the same data cell), only one word line is enabled, limiting access to a single port. The port is selected according to a predetermined list of priorities. Comparators then switch an appropriate multiplexer so that the highest priority bitlines are also routed to the lower priority ports. Such operation is explained in greater detail in the Furman and Bernstein patents, incorporated by reference herein.

Sometimes, though, it is desirable (and even important) to be able to pass data from an input (or write) port of a multiport register file to an output (or read) port thereof in the same cycle, instead of waiting for the usual delay of one or more cycles. This desired operation is referred to as "flow-through" of data. The multiple read inhibit scheme employed by Bernstein, Furman and others, however, imposes restrictions on the achievement of flow-through operation since they do not permit an input port and an output port simultaneously to access a single cell.

Accordingly, it is an object of the present invention to provide an improved multiport register file.

It is a further object of the present invention to provide a multiport register file supporting flow-through of data, whereby data presented at an input port of the register file during a given clock cycle can be passed to an output port of said file in the same cycle (and, preferably, in the same half cycle).

Yet another object of the invention is to provide a multiport register file supporting flow-through of data together with inhibition of multiple read operation.

BRIEF SUMMARY OF THE INVENTION

The foregoing and other objects of the present invention are achieved with a multiport RAM register file having (1) a multiport RAM, (2) a first set of multiplexers, termed input multiplexers, each input multiplexer having its output connected to one input of the multiport RAM and its inputs connected to respective ones of the input ports of the register file, (3) a second set of multiplexers, termed output multiplexers, the output of each such output multiplexer being connected to a respective one of the output ports of the register file and each input of the multiplexer being connected to a different one of the output ports of the RAM, (4) logic for controlling the operation of the input and output multiplexers and (5) address decoding logic for controlling the writing to the RAM. The logic for controlling the multiplexers comprises flow-through address comparators and read address comparators. The input multiplexers are controlled by the flow-through address comparators, while the output multiplexers are controlled by the read address comparators. The data at any input port of the register file may be written to any of the RAM data buses by selecting the input multiplexer appropriately. Because the bit buses (also called "bit lines" or "bitlines") which form the input and output ports of the RAM are being driven, this data simultaneously may be passed to the RAM output just as if the RAM were being read—i.e., as a flow-through. Further, if the RAM address lines are activated concurrently, this data can be written to a selected cell while it is flowing-through to the output port. The output multiplexers feed the data from the bit lines to a selected output port (or ports).

The invention will be more fully understood from the detailed description set forth below, which should be read in conjunction with the accompanying drawing. The invention is defined in the claims appended at the end of the detailed description, such description being exemplary only.

DETAILED DESCRIPTION OF AN ILLUSTRATIVE EMBODIMENT

Figure 1:
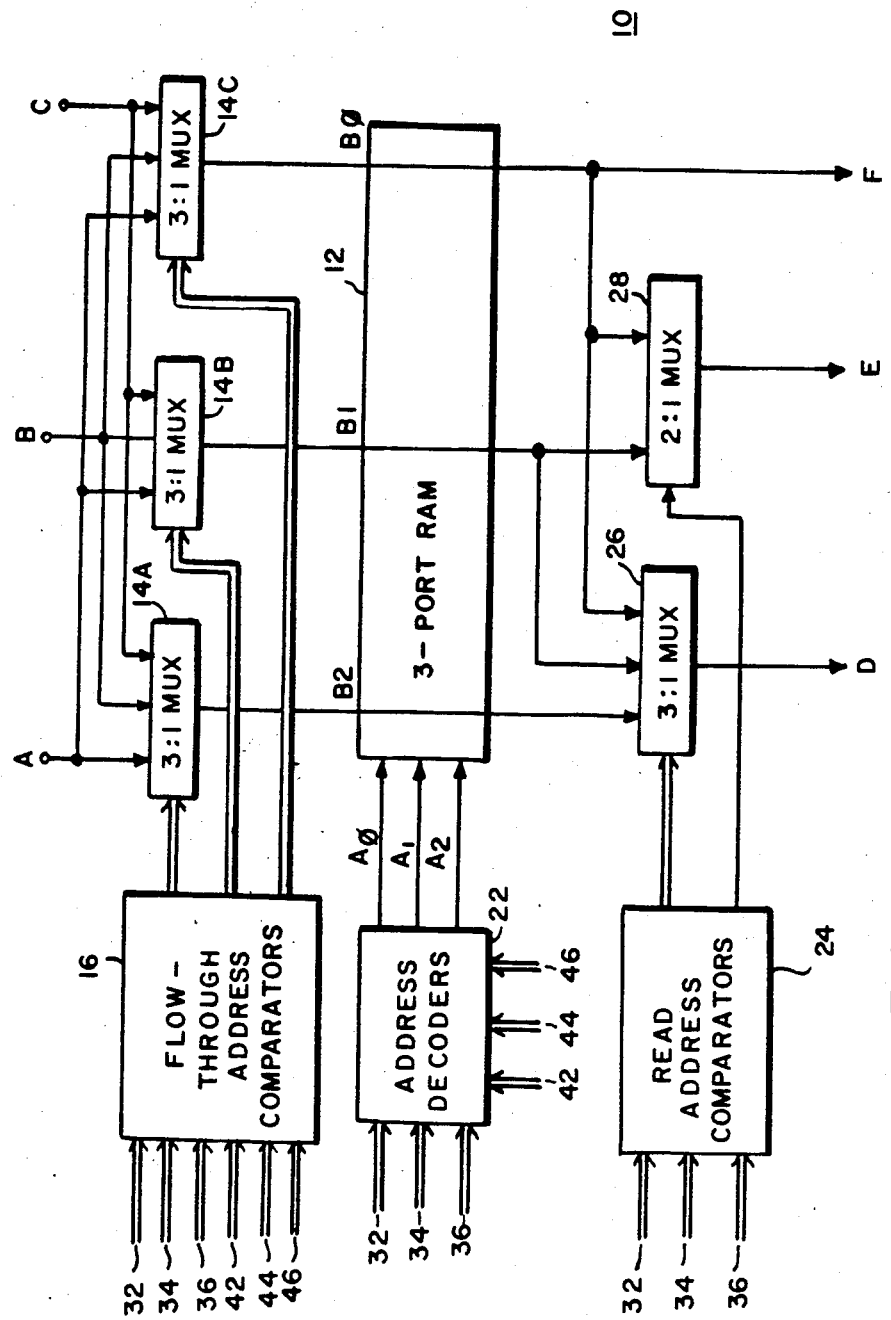
FIG. 1 is a block diagram of a multiport register file according to the present invention.

FIG. 1 shows a multiport register file 10 according to the present invention. For purposes of illustration, this register file is shown as having three input ports and three output ports and as using a three-ported RAM 12 (i.e., a RAM having three input ports and three output ports), though the invention should be understood to be useful for an arbitrary number of RAM and register file input and output ports. The input ports to the register file 10 are labelled A, B and C; the output ports are labelled D, E, and F. The RAM 12 has three data buses, labelled B2, B1 and B0; the accesses to these buses provide the RAM's input and output ports.

The three register file input ports A, B and C are connected in parallel to the inputs of three 3:1 multiplexers 14A, 14B and 14C respectively. The output of multiplexer (MUX) 14A is connected to data bit bus B2, the output of MUX 14B is connected to data bit bus B1 and the output of MUX 14C is connected to data bit bus B0. MUXes 14A, 14B and 14C are controlled by a set of flow-through address comparators 16. Generally, as hereinafter described, the addresses compared by flow-through address comparators 16 will be the input and output addresses for RAM write and read operations. Alternatively, a special purpose controller may be provided for actuating the multiplexers.

The three register file output ports D, E and F are connected to the bit buses B0, B1 and B2, as follows: Bit bus B0 is connected directly to output port F and also, in parallel, to one input of each of output multiplexers 26 and 28. Bit bus B1 is connected in parallel to a different, unique input of each of MUXes 26 and 28. Bit bus B2 is connected to a third unique input of MUX 26 but it is not connected to MUX 28 or to port F. MUXes 26 and 28 are controlled by read address comparators 24.

An address decoder 22 controls the operation of writing to the RAM 12.

The exemplary register file is provided with three sets of read address lines 32, 34, and 36 and three sets of write address lines 42, 44 and 46. The flow-through address comparators 16 are connected to these address lines to look for matches between read addresses and write addresses; the read address comparators 24 are connected to the three sets of read address lines to look for attempts to perform multiple simultaneous read operations and the address decoder is connected to both the write address lines and the read address lines. During one half of the clock cycle (preferably the first half), the address decoder 22 operates on the write address lines and supplie a write address to the RAM; during the other half cycle, the address decoder operates on the read address lines and supplies a read address to the RAM. During the write half of the clock cycle, the address decoder looks for write operations involving the same locations as flow-through operations.

To prevent the writing of data to a given location by more than one port attempting simultaneously to access such location, the input ports are assigned priorities. That is, if two or more sources are attempting to write data to the same location, flow-through address comparators 16 will detect that conflict and allow data to be written only through the highest (or, if there are only two input ports, higher) priority input port involved in the conflict. Assume that input port C has the highest priority, that input port B has the next lower priority and that input port A has the lowest priority. If two external devices (not shown) were simultaneously to supply data to input ports C and B while specifying to comparators 16 the same destination address in RAM 12, the comparators 16 would allow only the data at port C to be written to or through the RAM register file.

Similarly, the output ports also are ranked by priority. In the illustration, output port F has the highest priority, output port E has the next lower priority and output port D has the lowest priority. This simplifies the output multiplexing requirements. Thus, although read multiplexer 26 is a 3:1 multiplexer, read MUX 28 need multiplex only two inputs and no multiplexer at all is needed on output port F. (In general, there will be only n−1 output MUXes, where n represents the number of input ports; by contrast, there will be one input MUX per input port.) Consequently, when data is to be "flowed through" from an input port to multiple output ports, it may be supplied via any of the input MUXes 14A-14C in order to reach output port D through MUX 26, but since MUX 28 has only two inputs, output port E can only receive flow-through data coming from input MUXes 14B or 14C; while output port F can only receive data via data bit line B0 from input MUX 14C.

Whenever a read address supplied on read address lines 32, 34 or 36 corresponds to a write address supplied on one of write address lines 42, 44 or 46 (i.e., data is to be read from the same cell where data is to be written), a flow-through operation is to be performed. The comparators 16 then operate to steer the input data from the selected port A, B or C via one of the MUXes 14A-14C to the appropriate one of the data bit buses B2, B1 and B0; concurrently, the read comparators 24 operate to control the read MUXes 26A and 28 to steer data on the selected data bit bus to the desired output port or ports.

If, simultaneously, the same cell address is supplied to address decoder 22 (via write address lines 42, 44 or 46), the data being delivered on from the selected input port to the selected one of the data bit buses will be read into the addressed RAM cell.

Having thus described one particular embodiment, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is intended to be exemplary only, and not limiting. The invention is limited only as defined in the following claims and equivalents thereto.

What is claimed is:

1. A multiport RAM register file comprising:
   a. a read/write memory having a plurality of bit storage cells and a plurality of bit buses over which data may be written to or read from said bit storage cells, the number of bit buses being identified by the variable "n";
   b. a plurality of input multiplexers, each having multiple inputs and an output, the number of such inputs corresponding to the number of input ports to be provided;
   c. each bit bus being connected to the output of a different one of the input multiplexers;
   d. each input of said multiplexers being connected to an input port, such that each multiplexer has an input connected to each of the input ports;
   e. flow-through address comparator means adapted to receive at least one write address and at least one read address, compare said read addresses and said write addresses, and, upon detecting a read address corresponding to a write address, enable an appropriate one of the input multiplexers to steer input data from a selected one of the input ports to an appropriate one of the bit busses;

f. n−1 output multiplexers each having at least two inputs and a single output, with each input of each such output multiplexer being connected to a different one of said bit buses;

g. a plurality of output ports, one output port being connected directly to one of said bit buses and each of the other output ports being connected to the output of one of the output multiplexers;

h. read address comparator means for controlling the output multiplexers; and i. address decoder means operable in cooperation with the read/write memory to select addresses therein for reading and writing.

2. The multiport RAM register file of claim 1 wherein the flow-through address comparator means, when enabling one of the input multiplexers, selects the input multiplexer to be enabled according to a preestablished hierarchy of priorities among such multiplexers.

3. The multiport RAM register file of claim 2 further comprising the read address comparators (i) being adapted to receive at least two read addresses, (ii) comparing said read addresses, and (iii) upon detecting a pair of corresponding read addresses, selectively enabling the output multiplexers to steer read data from a selected one of the bit buses to an appropriate one of the output ports.

4. The multiport RAM register file of claim 3 wherein the read address comparator means, when enabling one of the output multiplexers, selects the output multiplexer to be enabled according to a preestablished hierarchy of priorities among such multiplexers.

* * * * *